United States Patent
Huang et al.

(10) Patent No.: US 9,881,840 B2
(45) Date of Patent: Jan. 30, 2018

(54) METHOD OF FABRICATING GATE ELECTRODE USING A TREATED HARD MASK

(75) Inventors: Yu-Lien Huang, Jhubei (TW); Ziwei Fang, Hsinchu (TW); Tsan-Chun Wang, Hsinchu (TW); Chii-Ming Wu, Taipei (TW); Chun Hsiung Tsai, Xinpu Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 969 days.

(21) Appl. No.: 13/157,179

(22) Filed: Jun. 9, 2011

(65) Prior Publication Data
US 2012/0315733 A1   Dec. 13, 2012

(51) Int. Cl.
*H01L 21/8238* (2006.01)
*H01L 21/3115* (2006.01)
*H01L 21/033* (2006.01)
*H01L 21/3213* (2006.01)

(52) U.S. Cl.
CPC .. *H01L 21/823814* (2013.01); *H01L 21/0337* (2013.01); *H01L 21/31155* (2013.01); *H01L 21/32139* (2013.01); *H01L 21/823807* (2013.01)

(58) Field of Classification Search
CPC ........... H01L 21/0337; H01L 21/32139; H01L 21/823814; H01L 21/823807; H01L 21/31155
USPC ......................................... 438/199, 763, 585
See application file for complete search history.

(56) References Cited

U.S. PATENT DOCUMENTS

| 6,750,127 | B1 * | 6/2004 | Chang et al. ................. 438/585 |
| 6,989,332 | B1 * | 1/2006 | Bell et al. ..................... 438/719 |
| 2005/0211665 | A1 * | 9/2005 | Gao et al. ........................ 216/26 |
| 2008/0254589 | A1 * | 10/2008 | Huang et al. ................. 438/389 |
| 2009/0166629 | A1 * | 7/2009 | Mehrad et al. ................. 257/57 |
| 2009/0179280 | A1 * | 7/2009 | Kohli et al. .................... 257/408 |
| 2009/0233385 | A1 * | 9/2009 | Okumura et al. ............. 438/16 |
| 2011/0108894 | A1 * | 5/2011 | Sung et al. ..................... 257/288 |
| 2011/0171804 | A1 * | 7/2011 | Wang et al. ................... 438/302 |
| 2011/0195548 | A1 * | 8/2011 | Yeh et al. ..................... 438/199 |

* cited by examiner

Primary Examiner — Christine Enad
(74) Attorney, Agent, or Firm — Hauptman Ham, LLP

(57) ABSTRACT

A hard mask layer with a limited thickness is formed over a gate electrode layer. A treatment is provided on the hard mask layer to transform the hard mask layer to be more resistant to wet etching solution. A patterning is provided on the treated hard mask layer and the gate electrode to from a gate structure.

20 Claims, 10 Drawing Sheets

METHOD OF FABRICATING GATE ELECTRODE USING A TREATED HARD MASK

CROSS REFERENCE

The present disclosure is related to the following commonly-assigned U.S. patent applications, the entire disclosures of which are incorporated herein by reference: U.S. application Ser. No. 12/700,862 for "A METHOD OF FABRICATING GATE ELECTRODE USING A TREATED HARD MASK".

BACKGROUND

The present disclosure relates generally an integrated circuit (IC) device and, more particularly, to a method for forming a gate structure.

As technology nodes shrink, in some IC designs, there has been a desire to replace the typically polysilicon gate electrode with a metal gate electrode to improve device performance with the decreased feature sizes. Providing metal gate structures (e.g., including a metal gate electrode rather than polysilicon) offers one solution. One process of forming a metal gate stack is termed "gate last" process in which the final gate stack is fabricated "last" which allows for a reduced number of subsequent processes, including high temperature processing, that must be performed after formation of the gate. Additionally, as the dimensions of transistors decrease, the thickness of the gate oxide must be reduced to maintain performance with the decreased gate length. In order to reduce gate leakage, high dielectric constant (high-k) gate insulator layers are also used which allow greater physical thicknesses while maintaining the same effective thickness as would be provided by a typical gate oxide used in larger technology nodes.

There are challenges to implement such features and processes in CMOS fabrication. As technology nodes continue to decrease, particularly to 22 nm technology node and beyond, the spacing between gate stacks continues to decrease, which affects the pocket/LDD implantation process. The issue will be worse when a thick hard mask is applied to a gate stack to increase the total thickness of the gate stack. A conventional hard mask layer needs to be initially thick compared with the thickness after etching due to its characteristics of being easily etched away in subsequent wet and/or dry etching processes. If the thickness of the hard mask layer is not initially thick, the remaining thickness of the hard mask layer after wet etching processes may not be sufficient for protecting the underlying material layer. However, the thick hard mask layer exacerbates the shadowing effects when forming the pocket/LDD implantation process.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
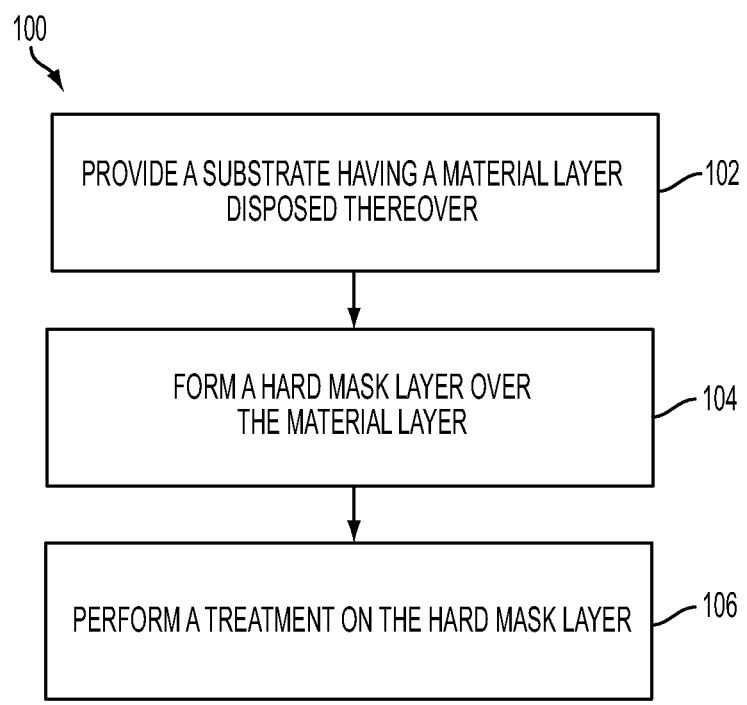
FIG. 1 is a flow chart of a method for fabricating an integrated circuit device according to aspects of the present disclosure.

The present disclosure relates generally to methods for manufacturing integrated circuit devices, and more particularly, to hard mask layers utilized for manufacturing integrated circuit devices.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference to FIGS. 1 and 2-9, a method 100 and a semiconductor device 200 are collectively described below. The semiconductor device 200 illustrates an integrated circuit, or portion thereof, that can comprise memory cells and/or logic circuits. The semiconductor device 200 can include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors, other suitable components, and/or combinations thereof. It is understood that additional steps can be provided before, during, and/or after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device 200.

Figure 2:
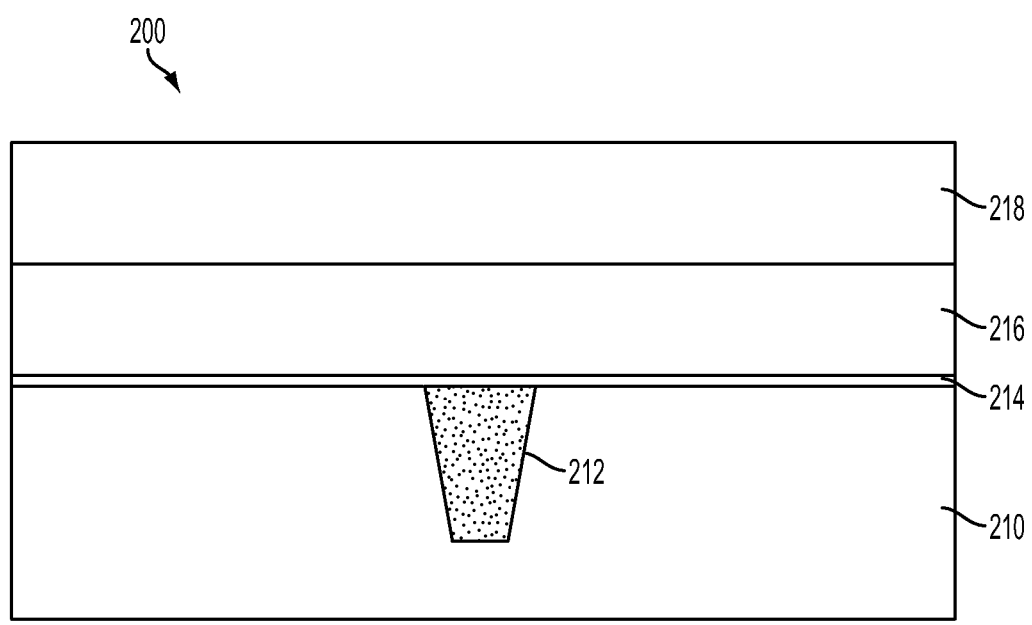
FIGS. 2-9 are various cross-sectional views of embodiments of an integrated circuit device during various fabrication stages according to the method of FIG. 1.

Referring to FIGS. 1 and 2, the method 100 begins at block 102 wherein a substrate 210 is provided. In the present embodiment, the substrate 210 is a semiconductor substrate comprising silicon. Alternatively, the substrate 210 comprises an elementary semiconductor including silicon and/or germanium in crystal; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the semiconductor substrate may be a semiconductor on insulator (SOI). In some examples, the semiconductor substrate may include a doped epi layer. In other examples, the silicon substrate may include a multilayer compound semiconductor structure.

The substrate 210 may include various doped regions depending on design requirements as known in the art (e.g., p-type wells or n-type wells). The doped regions may be doped with p-type dopants, such as boron or $BF_2$, and/or n-type dopants, such as phosphorus or arsenic. The doped regions may be formed directly on the substrate 210, in a P-well structure, in a N-well structure, in a dual-well structure, or using a raised structure. The semiconductor substrate 210 may further include various active regions, such as regions configured for an N-type metal-oxide-semiconductor transistor device (referred to as an NMOS) and regions configured for a P-type metal-oxide-semiconductor transistor device (referred to as a PMOS). It is understood that the semiconductor device 200 may be formed by CMOS technology processing, and thus some processes are not described in detail herein.

An exemplary isolation region 212 is formed in the substrate 210 to isolate various regions of the substrate 210, and in the present embodiment, to isolate the NMOS and PMOS device regions. The isolation region 212 utilizes isolation technology, such as local oxidation of silicon (LOCOS) or shallow trench isolation (STI), to define and electrically isolate the various regions. In the present embodiment, the isolation region 212 includes a STI. The isolation region 212 comprises silicon oxide, silicon nitride, silicon oxynitride, other suitable materials, or combinations thereof. The isolation region 212 is formed by any suitable process. As one example, the formation of an STI includes a photolithography process, etching a trench in the substrate (for example, by using a dry etching and/or wet etching process), and filling the trench (for example, by using a chemical vapor deposition process) with one or more dielectric materials. In some examples, the filled trench may have a multi-layer structure such as a thermal oxide liner layer filled with silicon nitride or silicon oxide.

A material layer is formed over the substrate 210. The material layer includes one or more material layers comprising any suitable material and thickness. The material layer can include interfacial layers, capping layers, diffusion/barrier layers, dielectric layers, high-k dielectric layers, conductive layers, gate layers, liner layers, seed layers, adhesion layers, other suitable layers, and/or combinations thereof. The material layer is formed by any suitable process including chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. The semiconductor device 200 may include one or more antireflective coating layers, such as a top antireflective coating layer and/or a bottom antireflective coating layer.

In at least one embodiment, the material layer includes a gate dielectric layer 214 and a gate electrode layer 216. The gate dielectric layer 214 is formed over the substrate 210 by any suitable process to any suitable thickness. The gate dielectric layer 214, for example, is silicon oxide, silicon oxynitride, silicon nitride, spin-on glass (SOG), fluorinated silica glass (FSG), carbon doped silicon oxide, Black Diamond® (Applied Materials of Santa Clara, Calif.), Xerogel, Aerogel, amorphous fluorinated carbon, Parlyene, BCB (bis-benzocyclobutenes), SiLK (Dow Chemical, Midland, Mich.), polyimide, other suitable dielectric materials, or combinations thereof. The gate dielectric layer 214 may comprise a high-k dielectric material, such as $HfO_2$, HfSiO, HfSiON, HfTaO, HfSiO, HfZrO, other suitable high-k dielectric materials, and/or combinations thereof. The gate dielectric layer 214 can further include an interfacial layer, which comprises a grown silicon oxide layer (e.g., thermal oxide or chemical oxide) or silicon oxynitride (SiON).

The gate electrode layer 216 is formed over the gate dielectric layer 214 by any suitable process to any suitable thickness. In the present embodiment, the gate electrode layer 216 is a polysilicon layer. The polysilicon (or poly) layer is formed by CVD or other suitable deposition process. For example, silane ($SiH_4$) may be used as a chemical gas in the CVD process to form the gate electrode layer 216. The gate electrode layer 216 may include a thickness ranging from about 400 Angstroms to about 800 Angstroms (Å). In other embodiments, gate electrode layer 216 and/or the gate dielectric layer 214 may be sacrificial layers and will be removed by a replacement step after a gate patterning process.

The method 100 continues with block 104 in which a hard mask layer 218 is formed over the gate electrode layer 216 by any suitable process to any suitable thickness. The hard mask layer 218, in at least one embodiment, includes silicon oxide. The hard mask layer 218, in other embodiments, may include silicon nitride (SiN), silicon oxynitride (SiON), silicon carbide (SiC), SiOC, spin-on glass (SOG), a low-k film, tetraethylorthosilicate (TEOS), plasma enhanced CVD oxide (PE-oxide), high-aspect-ratio-process (HARP) formed oxide, amorphous carbon material, tetraethylorthosilicate (TEOS), other suitable materials, and/or combinations thereof. The silicon oxide layer may be formed using methods such as CVD, PVD, or ALD and may have a thickness ranging from about 100 Angstroms to about 500 Angstroms.

Figure 3:
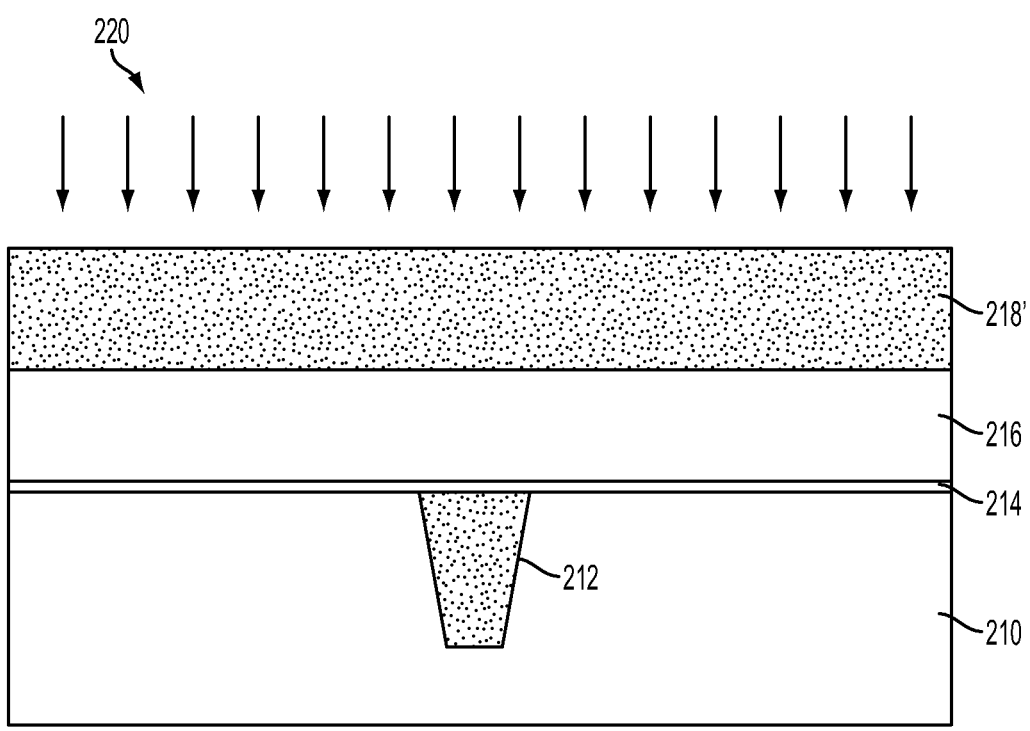

Referring to FIGS. 1 and 3, the method 100 proceeds to block 106 wherein a treatment 220 is performed to transform the hard mask layer 218 to a treated hard mask layer 218'. The treated hard mask layer 218' is designed to be more resistant to wet chemicals used in subsequent wet etching processes, such as hydrogen fluoride (HF) solution and/or to be more resistant to etching gases used in the subsequent dry etching processes, such as $CF_X$ gas (e.g., $CF_4$, $C_2F_2$), HBr, and/or $Cl_2$. In some embodiments, the treatment 220 is a doping process introducing additional species in the hard mask layer 218. In some embodiments, the doping process introduces a high dopant concentration in the treated hard mask layer 218', therefore, the treated hard mask layer 218' is able to resist the wet chemicals and etching gases used in subsequent etching processes. For example, the dopant concentration in treated hard mask layer 218' is equal to or greater than about 5E21 atoms/cm³.

In some embodiments, the additional species may be introduced by ion beams (ion implantation, or beam line) or by plasma doping (PLAD). In at least one embodiment, the hard mask layer 218 is completely transformed to the treated hard mask layer 218', therefore the treated hard mask layer 218' with the species has a thickness the same as the original thickness of the hard mask layer 218. In other embodiments, the treatment 220 transforms a portion of the hard mask layer 218 to the treated hard mask layer 218' and leave another portion of the hard mask layer 218 untransformed, wherein the treated hard mask layer 218' with the species has a thickness not less than about 95% of the original thickness of the hard mask layer 218.

Alternatively, the formation of the treated hard mask layer 218' (including forming the hard mask layer 218 and performing the treatment 220 on the hard mask layer 218) may be separated into several steps, wherein each step comprises forming a hard mask sub layer and treating the hard mask sub layer to produce a treated hard mask sub layer. The combination of all the treated hard mask sub layers constitute the treated hard mask layer 218'. The thickness of each of the hard mask sub layers may be the same or different. The combination of all the hard mask sub layers has a combined thickness the same as the thickness of hard mask layer 218 mentioned above. The combination of all the treated hard mask sub layers may have a thickness the same as the thickness of the hard mask layer 218 or not less than about 95% of the original thickness of the hard mask layer 218 as mentioned above.

In at least one embodiment, the treatment 220 transforms the hard mask layer 218 to the treated hard mask layer 218' by introducing two species therein. One of the species may function as reducing wet etching rate of the treated hard mask layer 218', another species may function to reduce a dry etching rate. For example, the treatment 220 introduces carbon (C) species to reduce wet etching rate and introduces boron (B) species to reduce the dry etching rate. In other embodiments, the treatment 220 transforms the hard mask layer 218 to the treated hard mask layer 218' by introducing one species, wherein this species may cause the treated hard mask layer 218' with a reduced wet etching rate and reduced dry etching rate simultaneously. For example, the treatment 220 transforms the hard mask layer 218 to the treated hard mask layer 218' by introducing silicon (Si) species to reduce wet etching rate and dry etching rate.

If the doping process is performed by ion beams, the dopants, which are ions, may be directed toward the hard mask layer 218 vertically, or tilted at an angle. In some embodiments, the angle is in a range from about 0° to about 60°. In other embodiments, the angle is in a range from about 10° to about 30°. In some embodiments, the doping energy is in a range from about 0.5 KeV to about 60 KeV. In some embodiment, the dose is not less than about 1E16 ions/cm$^2$ to form the treated hard mask layer 218' with high dopant concentration as mentioned above. Therefore, the treated hard mask layer 218' is able to resist the wet chemicals and etching gases used in subsequent etching processes.

As mentioned above, the doping process may also be achieved by plasma doping. Since the plasma ions in the plasma sheath could move in different directions, not just directed towards the hard mask layer 218 as the dopants from ion beams, the plasma ions may arrive at the surface in a range of angles, instead of being at a certain angle as in the case of ion implantation by ion beams. As a result, plasma doping is ideal for achieving high dopant concentration in the treated hard mask layer 218'. Plasma doping is performed in a plasma doping system. An example of plasma doping systems is a PLAD system, made by Varian Semiconductor Equipment Associates Inc. of Gloucester, Mass. In at least one embodiment, the doping gas is made by one or more carbon-containing gas, such as $CH_4$, CxHy (where x and y are integers); boron-containing gas, such as $BF_3$ or $B_2H_6$; or combinations thereof. For example, x is in a range from 2 to 12 and y is in a range from 2 to 26. In other embodiments, the doping gas is made by one or more silicon-containing gas, such as $SiH_4$, other suitable gases, or combinations thereof.

The doping gas may also include a carrier gas, such as $H_2$, He, Ar, Ne, Kr, Xe. The percentage of the carbon-containing gas, the boron-containing gas, or the silicon-containing gas may be in a range from about 1% to about 100%. In some embodiments, the process flow is in a range from about 50 sccm to about 500 sccm. In some embodiments, the pressure of the plasma process is in a range from about 5 mTorr to about 50 mTorr. The radio frequency (RF) power is in a range from about 100 watts (W) to about 1000 W and at a radio frequency in a range from about 2 kilohertz (KHz) to about 13.6 megahertz (MHz), in accordance with some embodiments. The substrate 210 may be or may not be biased. The dopant depth can be increased, if the substrate 210 is biased. In some embodiments, the bias voltage is in a range from about 0 KV to about 10 KV. In some embodiments, the RF power supply can have dual frequencies. The doping plasma may be generated in the processing chamber or remotely (remote plasma). In some embodiments, the dose is not less than about 1E16 ions/cm$^2$ to form the treated hard mask layer 218' with high dopant concentration as mentioned above. Therefore, the treated hard mask layer 218' is able to resist the wet chemicals and etching gases used in subsequent etching processes.

Figure 3A:
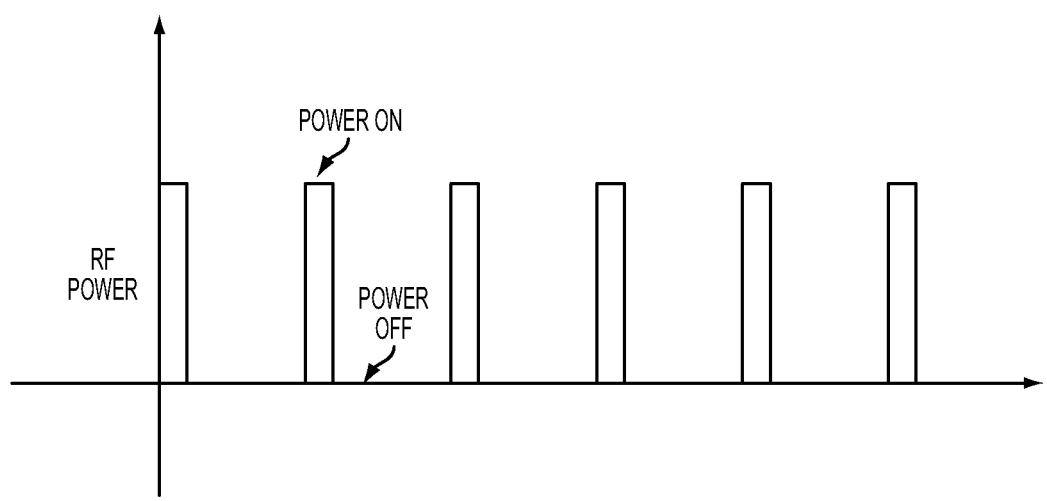

The RF power for generating the plasma could be pulsed. FIG. 3A shows a diagram of power cycle of a pulsed plasma, in accordance with some embodiments. FIG. 3A shows that the RF power is turned on and off periodically. The duty ratio (power-on-time/total-time) of pulse could be in a range from about 5% to about 95% in accordance with some embodiments. In some embodiments, the plasma doping is performed for duration in a range from about 10 seconds to about 5 minutes.

After the implanting or doping is performed, the substrate 210 is annealed to allow the introduced species to settle in the treated hard mask layer 218', in accordance with some embodiments. The annealing temperature may be in a range from about 600° C. to about 1350° C. The annealing used may be performed by rapid thermal annealing (RTA) or by furnace. Alternatively, the annealing process can be laser annealing or flash annealing. In some embodiments, the annealing time can be in a range from about 50 µs (micro seconds) to about 10 minutes. The heat can be provided to the front side of the substrate 210, backside of the substrate 210, or both front and back sides of the substrate 210. In some embodiments, this anneal operation can be skipped.

After performing the treatment 220, the formed treated hard mask layer 218' has more etching resistance when exposed to a wet etching process and/or a dry etching process. For example, the treated hard mask layer 218' has an etching rate lower than the etching rate of the hard mask layer 218 in wet etching process using HF solution. The subsequent wet etching process may utilize a diluted hydrofluoric acid (DHF) solution (a mixed solution of HF and de-ionized water (DIW)) for a dipping process, and the DHF solution may have any suitable concentration (e.g., HF:DIW=1:100) at a suitable temperature (e.g., elevated or room temperature). The etching rates of the hard mask layer 218 and the treated hard mask layer 218', for example, are around 105 Å/min. and less than about 20 Å/min, in the DHF solution with ¹⁄₁₀₀ concentration at room temperature, respectively. Since the treated hard mask layer 218' is etched away (consumed) by a relatively smaller amount in the subsequent HF or DHF solution, the hard mask layer 218 could be designed to have a relatively thin thickness. Therefore, the thin hard mask layer can prevent the shadowing side effect during a subsequent pocket implantation and/or lightly doped drain (LDD) implantation to, thus, improve overall device performance. Further, the treated hard mask layer 218' can function well as a hard mask to protect the underlying gate electrode layer 216 and/or define a pattern to be transferred to the gate dielectric layer 214 and the gate electrode layer 216.

Figure 4:
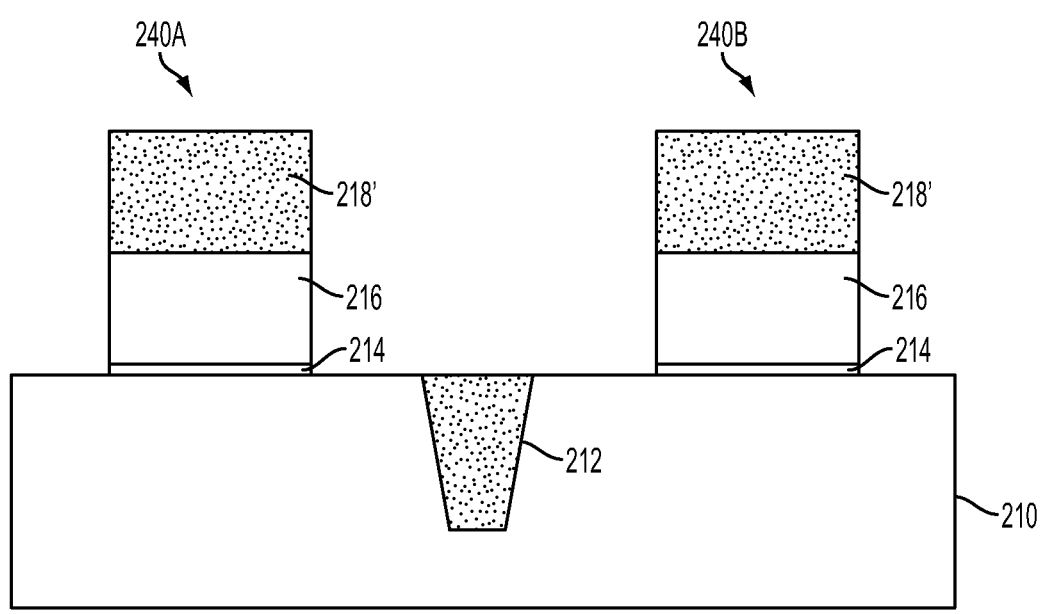

Referring to FIG. 4, gate structures comprising a gate dielectric layer 214, a gate electrode layer 216, and a treated hard mask layer 218' are formed by any suitable process. For example, a layer of photoresist (not shown) is formed over the treated hard mask layer 218' by a suitable process, such as spin-on coating, and patterned to form a patterned photoresist feature. The pattern of the photoresist can then be transferred by a dry etching process to the underlying gate dielectric layer 214, the gate electrode layer 216, and the treated hard mask layer 218' to form the gate structures. Additionally, an anti-reflective coating (ARC) layer (not shown) may be formed on the treated hard mask layer 218' and under the layer of photoresist to enhance a subsequent patterning process as known in the art. The photolithography patterning processes may include soft baking, mask aligning, exposure, post-exposure baking, developing the photoresist, rinsing, drying (e.g., hard baking), other suitable processes, and/or combinations thereof. The photolithography exposing process may also be implemented or replaced by other proper methods such as maskless photolithography, electron-beam writing, ion-beam writing, and molecular imprint. Then, an etching process, including dry etching, wet etching, and/or other etching methods (e.g., reactive ion etching) is provided to form a gate structure for the PMOS device 240A and a gate structure for the NMOS device 240B. The photoresist layer may be stripped thereafter. It is understood that the above examples do not limit the processing steps that may be utilized to form the gate structures. Alternatively, the treatment 220 can be provided to the hard mask layer 218 after forming the gate structures of the PMOS device 240A and the NMOS device 240B.

Figure 5:
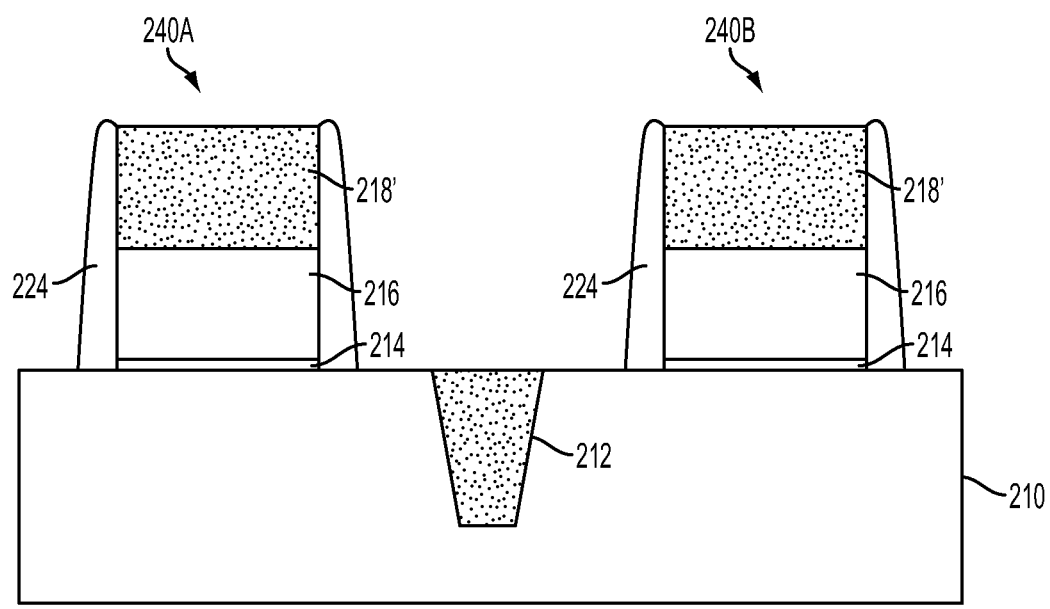

Referring to FIG. 5, offset spacers 224 are formed overlying sidewalls of the PMOS/NMOS devices 240A/240B. In an example, the offset spacers 224 are formed by blanket depositing a dielectric layer over the gate structures of PMOS/NMOS devices 240A/240B and the substrate 210, and then patterning the dielectric layer to form offset spacers 224. The dielectric layer comprises, for example, silicon nitride, silicon oxide, silicon carbide, silicon oxynitride, other suitable materials, and/or combinations thereof. The thickness of the dielectric layer ranges from 100 A to about 300 A. The dielectric layer may be formed by using commonly used techniques, such as plasma enhanced chemical vapor deposition (PECVD), low-pressure chemical vapor deposition (LPCVD), sub-atmospheric chemical vapor deposition (SACVD), atomic layer deposition (ALD), and the like. The patterning may be performed by either a wet etching process, a dry etching process, or combinations thereof. Preferably, the dielectric layer is patterned by a dry etching process. More preferably, the dielectric layer is patterned by an anisotropic dry etching process. Alternatively, the treatment 220 can be provided to the hard mask layer 218 after forming the offset spacers 224.

Figure 6:
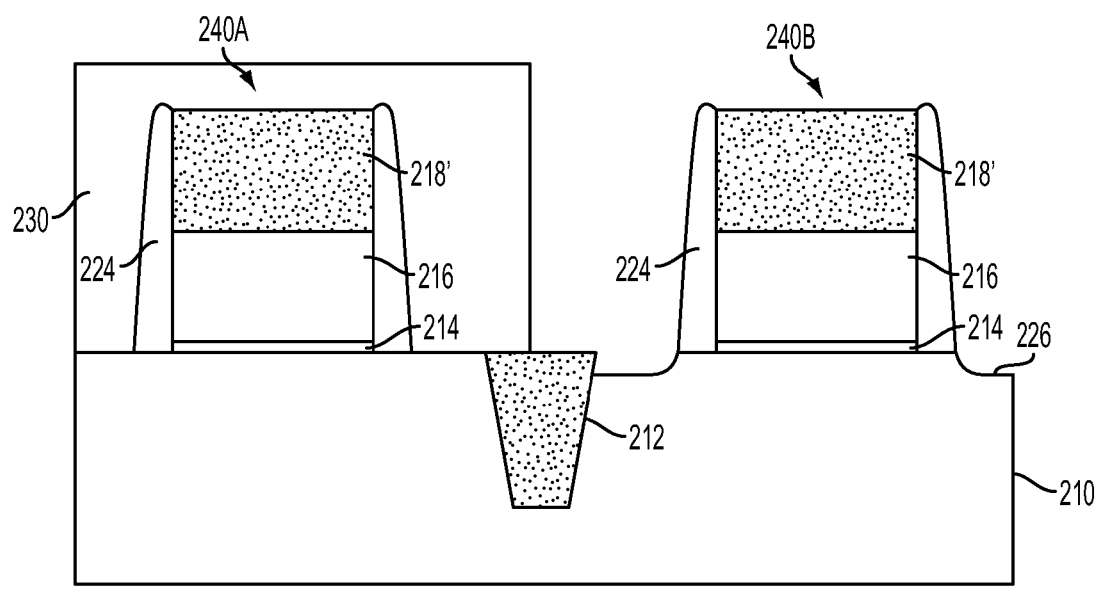
Figure 7:
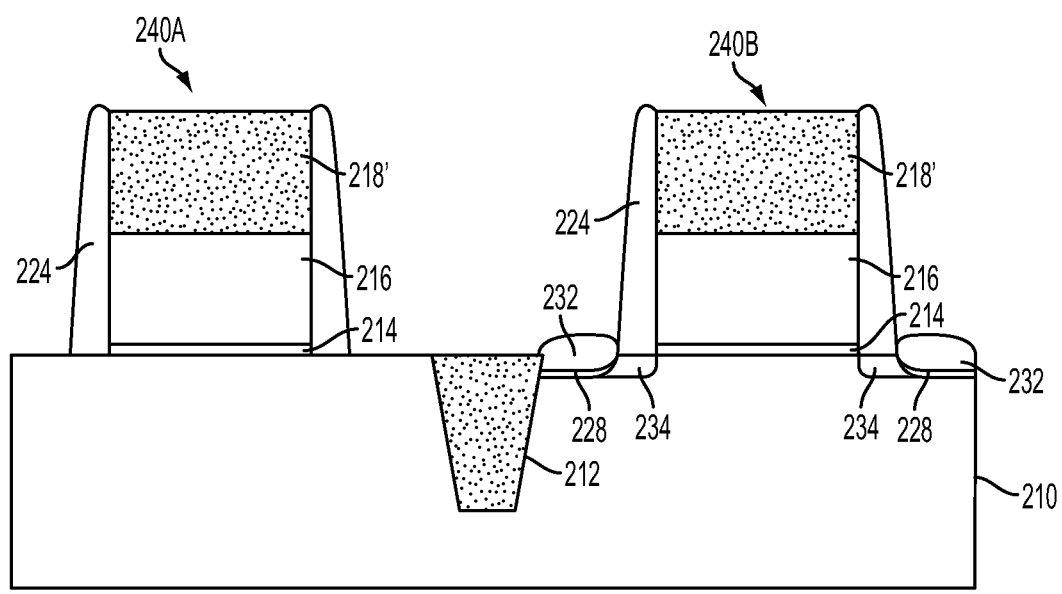

Referring to FIG. 6, recesses 226 may be optionally formed on each side of the gate structure of NMOS device 240B in the substrate 210. Recesses are not formed around the PMOS device 240A at this time because of a protector 230, e.g., a photoresist pattern, thereon while the NMOS device 240B is exposed. The recesses 226 may be formed by any suitable process and are substantially aligned with edges of the offset spacers 224 of the gate structure of NMOS device 240B. The recesses 226 may be formed by a selective etching process, which can include one or more wet etching and/or dry etching processes. Then, the protector 230 may be removed by a stripping process as known in the art. Thereafter, N-type strained source/drain (NSSD) regions 228 are formed by any suitable process over the recesses 226 as illustrated in FIG. 7. In at least one embodiment, the NSSD regions 228 are formed by one or more epitaxial growth processes to any suitable thickness. An exemplary NSSD regions 228 thickness is approximately 200 Å. The epitaxial process may include CVD deposition techniques (e.g., vapor-phase epitaxy (VPE) and/or ultra-high vacuum CVD (UHV-CVD)), molecular beam epitaxy, and/or other suitable processes. The epitaxial process may use gaseous and/or liquid precursors, which may interact with the composition of the substrate 210. The NSSD regions 228 comprise any suitable material, such as epitaxially grown silicon, SiC, and/or combinations thereof. A cleaning process may be subsequently performed, such as a cleaning process utilizing a DHF cleaning solution.

Subsequently, various implantation processes are performed on the substrate 210. The various implantation processes may form various doped regions. The doped regions may comprise various doping profiles and may be formed by a plurality of implantation processes. In at least one embodiment, N-type lightly doped source/drain (NLDD) regions 232 may be formed in or under the NSSD regions 228 by one or more ion implantation processes. The NLDD regions 232 are substantially aligned with edges of the offset spacers 224 of the gate structure of NMOS device 240B. In other embodiments, P-type pocket regions 234 may be formed adjacent to the NSSD regions 228 and under the offset spacers 224 by one or more ion implantation processes. The implantation for forming the NLDD/P-type pocket regions 232, 234 may employ tilt angle processes by any suitable angles. In at least one embodiment, approximately 25° to about 30° of the tilt angle is utilized. The tilt-angle implantation may be subject to shadowing side effects if the thickness of the gate structure of NMOS device 240B is too high. As noted above, the treated hard mask layer 218' has the relatively low etching rate in wet etching processes, therefore, the hard mask layer 218 may be relatively thin (e.g., less than about 500 Angstroms) to prevent from the shadowing effects during tilt angle implantation processes for forming the NLDD/P-type pocket regions.

Figure 8:
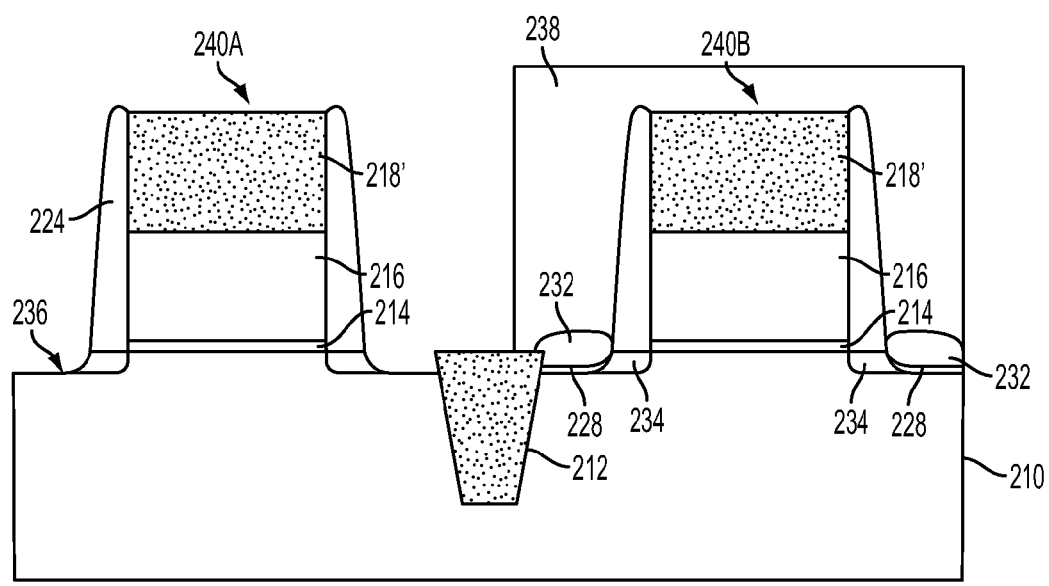
Figure 9:
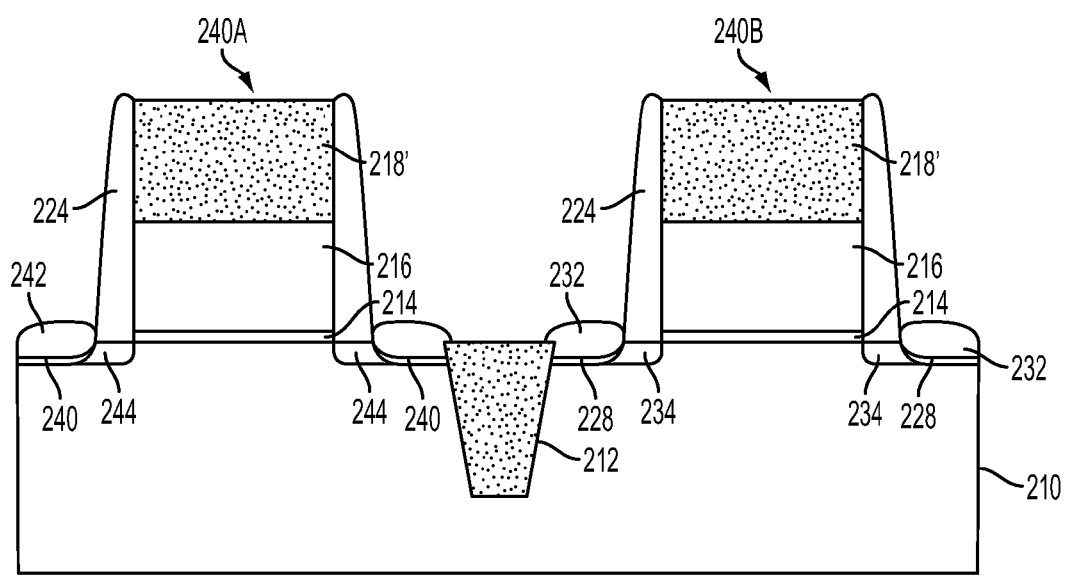

Referring to FIG. 8, recesses 236 are formed on each side of the gate structure of PMOS device 240A in the substrate 210. A protector 238, e.g., photoresist pattern, may be formed overlying the NMOS device 240B while the PMOS device 240A is exposed. The recesses 236 are formed on each side of the gate structure of PMOS device 240A by any suitable process, and are substantially aligned with edges of the offset spacers 224 of the gate structure of PMOS device 240A. The recesses 236 may be formed by a selective etching process, which can include one or more wet etching and/or dry etching processes. Then, the protector 238 is removed by a stripping process as known in the art. The P-type strained source/drain drain (PSSD) regions 240 are formed by any suitable process over the recesses 236 as illustrated in FIG. 9. In at least one embodiment, the PSSD regions 240 are formed by one or more epitaxial growth processes to any suitable thickness. An exemplary PSSD regions 240 thickness is approximately 200 Å. The epitaxial process may include CVD deposition techniques (e.g., vapor-phase epitaxy (VPE) and/or ultra-high vacuum CVD (UHV-CVD)), molecular beam epitaxy, and/or other suitable processes. The epitaxial process may use gaseous and/or liquid precursors, which may interact with the composition of the substrate 210. The PSSD regions 240 comprise any suitable material, such as epitaxially grown SiGe. A cleaning process may be subsequently performed, such as cleaning process utilizing a DHF cleaning solution.

Subsequently, various implantation processes are performed on the substrate 210. The various implantation processes may form various doped regions. The doped regions may comprise various doping profiles and may be formed by a plurality of implantation processes. In at least one embodiment, P-type lightly doped source/drain (PLDD) regions 242 may be formed in PSSD regions 240 by one or more ion implant processes. The PLDD regions 242 are substantially aligned with the edges of the offset spacers 224 of the gate structure of PMOS device 240A. In other embodiments, N-type pocket regions 244 may be formed adjacent to the PSSD regions 240 and under the offset spacers 224 by one or more ion implant processes. The implantation for forming the PLDD/N-type pocket regions 242,244 may employ tilt angle processes at any suitable angles. In at least one embodiment, the angles for forming the PLDD/N-type pocket regions 242,244 are similar to the angles for forming the NLDD/P-type pocket regions 232, 234. In at least one embodiment, approximately about 25° to about 30° of the tilt angle is utilized. The tilt angle implantation may be subject to shadowing side effects if the thickness of the gate structure of PMOS device 240A is too high. As noted above, the treated hard mask layer 218' has the relatively low etching rate in wet etching processes, therefore, the hard mask layer 218 may be the relatively thin compared with an untreated hard mask to prevent the shadowing effects during tilt angle implantation processes for forming the PLDD/N-type pocket regions.

Source/drain (S/D) regions (not shown) may be formed in the substrate 210 for the NMOS/PMOS devices 240B, 240A by a conventional implantation process. One or more contact features (not shown), such as silicide regions, may also be formed by any suitable process on the S/D regions.

Subsequent processing may implement a gate replacement process. For example, metal gates may replace the gate electrode layer 216 (i.e., polysilicon gate layer) of the gate structures of the NMOS/PMOS devices 240B, 240A. A first metal gate having a first work function may be formed in the gate structure of the NMOS devices 240B and a second gate structure having a second work function may be formed in the gate structure of the PMOS devices 240A. The metal gates may comprise any suitable material including aluminum, copper, tungsten, titanium, tantalum, tantalum aluminum, tantalum aluminum nitride, titanium nitride, tantalum nitride, nickel silicide, cobalt silicide, silver, TaC, TaSiN, TaCN, TiAl, TiAlN, WN, metal alloys, other suitable materials, and/or combinations thereof.

Subsequent processing may form various contacts/vias/lines and multilayer interconnect features (e.g., metal layers and interlayer dielectrics) on the substrate 210, configured to connect the various features or structures of the semiconductor device 200. The additional features may provide electrical interconnection to the device. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

In some embodiments, a method of fabricating an integrated circuit device, the method comprises providing a substrate, forming a material layer over the substrate, forming a hard mask layer over the material layer, providing a treatment to the hard mask layer to introduce dopants therein, and patterning the hard mask layer and the material layer. A dose of the treatment is not less than about 1E16 ions/cm$^2$.

In some embodiments, a method for manufacturing a gate structure, the method comprises forming a gate electrode layer over a substrate, forming a hard mask layer over the gate electrode layer, providing a treatment on the hard mask layer to form a treated hard mask layer, and patterning the treated hard mask layer and the gate electrode layer. The treatment comprises introducing dopants into the hard mask layer with a dose not less than about 1E16 ions/cm$^2$, and annealing the hard mask layer.

In some embodiments, a method for manufacturing a gate electrode, the method comprises providing a substrate, forming a gate electrode layer over the substrate, forming a first hard mask layer over the gate electrode layer, treating the first hard mask layer to form a first treated hard mask layer, forming a second hard mask layer over the first treated hard mask layer, treating the second hard mask layer to form a second treated hard mask layer, patterning the first treated hard mask layer, the second treated hard mask layer, and the gate electrode layer to form a gate structure of PMOS device and a gate structure of NMOS device, forming n-type strained source/drain (NSSD) regions in the substrate, forming p-type strained source/drain (PSSD) regions in the substrate, forming n-type lightly-doped source/drain (NLDD) regions in or under the NSSD regions by a first tilt-angle ion implantation, and forming p-type lightly-doped source/drain (PLDD) regions in the PSSD regions by a second tilt-angle ion implantation. The NSSD regions are adjacent to edges of the gate structure of NMOS device. The PSSD regions are adjacent to edges of the gate structure of PMOS device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating an integrated circuit device, the method comprising:
   providing a substrate;
   forming a material layer over the substrate;
   forming a hard mask layer over the material layer;
   providing a treatment to the hard mask layer to introduce dopants therein, wherein a dose of the treatment is not less than about 1E16 ions/cm$^2$;
   annealing the treated hard mask layer; and
   patterning the treated hard mask layer and the material layer.

2. The method of claim 1, wherein the hard mask layer is silicon oxide.

3. The method of claim 1, wherein the hard mask layer has a thickness less than or equal to approximately 500 Angstroms.

4. The method of claim 1, wherein the dopants comprise silicon (Si).

5. The method of claim 1, wherein the dopants comprise carbon (C) and boron (B).

6. The method of claim 1, wherein the treatment is performed by at least one of ion beams or plasma doping (PLAD).

7. The method of claim 6, wherein a process flow of the plasma doping is in a range from about 50 sccm to about 500 sccm and a process pressure of the plasma doping is in a range from about 5 mTorr to about 50 mTorr.

8. The method of claim 6, wherein the plasma doping is performed using a radio frequency power in a range from about 100 watts (W) to about 1000 W.

9. The method of claim 6, wherein the plasma doping is performed using a pulsed plasma with a duty ratio (power-on-time/total-time) in a range from about 5% to about 95% and for a duration in a range from about 10 seconds to about 5 minutes.

10. The method of claim 1, wherein the treated hard mask layer has a dopant concentration equal to or greater than about 5E21 atoms/cm$^3$.

11. The method of claim 1, further comprising a step of performing LDD regions in the substrate by an implantation process utilizing a tilt-angle of approximately 25° to about 30°.

12. The method of claim 1, wherein annealing the treated hard mask layer comprises annealing the treated hard mask layer at an annealing temperature ranging from about 600° C. to about 1350° C.

13. A method for manufacturing a gate structure, the method comprising:
 forming a gate electrode layer over a substrate;
 forming a hard mask layer over the gate electrode layer;
 providing a treatment on the hard mask layer to form a treated hard mask layer, the treatment comprising
  introducing dopants into the hard mask layer with a dose not less than about 1E16 ions/cm$^2$; and
  annealing the hard mask layer; and
 patterning the treated hard mask layer and the gate electrode layer.

14. The method of claim 13, wherein a temperature of the step of annealing ranges from about 900° C. to about 1350° C.

15. The method of claim 13, wherein the dopants comprise boron and carbon.

16. The method of claim 13, wherein the dopants comprise silicon.

17. The method of claim 13, wherein the treatment is performed by ion beams or plasma doping (PLAD).

18. The method of claim 13, wherein the treated hard mask layer has a dopant concentration equal to or greater than about 5E21 atoms/cm$^3$.

19. A method for manufacturing a gate electrode, the method comprising:
 providing a substrate;
 forming a gate electrode layer over the substrate;
 forming a first hard mask layer over the gate electrode layer;
 treating the first hard mask layer to form a first treated hard mask layer;
 forming a second hard mask layer over the first treated hard mask layer;
 treating the second hard mask layer to form a second treated hard mask layer;
 patterning the first treated hard mask layer, the second treated hard mask layer, and the gate electrode layer to form a gate structure of PMOS device and a gate structure of NMOS device;
 forming n-type strained source/drain (NSSD) regions in the substrate, wherein the NSSD regions are adjacent to edges of the gate structure of NMOS device;
 forming p-type strained source/drain (PSSD) regions in the substrate, wherein the PSSD regions are adjacent to edges of the gate structure of PMOS device;
 forming n-type lightly-doped source/drain (NLDD) regions in or under the NSSD regions by a first tilt-angle ion implantation; and
 forming p-type lightly-doped source/drain (PLDD) regions in the PSSD regions by a second tilt-angle ion implantation.

20. The method of claim 19, wherein an etching rate of the first or the second treated hard mask layer in a 1/100 diluted hydrofluoric (DHF) solution at room temperature is less than about 20 Å/min.

* * * * *